United States Patent [19]

Davis

[11] Patent Number: 4,817,011

[45] Date of Patent: Mar. 28, 1989

[54] AUTOMATED MODELING METHOD FOR TUNING TRANSFORMERS

[75] Inventor: John Davis, Snohomish, Wash.

[73] Assignee: Honeywell, Inc., Minneapolis, Minn.

[21] Appl. No.: 5,052

[22] Filed: Jan. 20, 1987

[51] Int. Cl.⁴ .................. G06F 15/20; G01R 17/06
[52] U.S. Cl. ........................... 364/481; 324/81; 324/99 R; 364/482; 364/578; 379/403
[58] Field of Search ............ 364/480, 481, 483, 571, 364/578, 579, 482; 324/81, 99 R, 73 AT, 76 R, 82; 379/403, 404

[56] References Cited

U.S. PATENT DOCUMENTS

| | | | |
|---|---|---|---|
| 3,333,201 | 7/1967 | Hopengarten | 324/81 |
| 4,198,606 | 4/1980 | Baba | 324/81 |
| 4,342,093 | 7/1982 | Miyoshi | 364/578 |
| 4,395,599 | 7/1983 | Seidel | 379/403 |
| 4,590,581 | 5/1986 | Widdoes, Jr. | 364/578 |
| 4,602,338 | 7/1986 | Cook | 364/482 |
| 4,629,977 | 12/1986 | English | 324/81 |
| 4,677,666 | 6/1987 | Herman | 324/99 R |

*Primary Examiner*—Parshotam S. Lall
*Assistant Examiner*—Kevin J. Teska

*Attorney, Agent, or Firm*—C. Lamont Whitham; Michael E. Whitham

[57] ABSTRACT

A computer automated method and system is used to time transformers to produce a resonant circuit for matching elements to a circuit is disclosed. The modeling method uses a computer to select discrete values for resistive and capacitive loads to be connected to the secondary of a transformer. For each combination of resistive and capacitive load connected to the secondary, the circuit is measured for phase angle. This data is used by the computer software to predict the tuning of the transformer to a load combination that is not actually connected to the transformer. This is done by determining two load lines for actual values of resistance and capacitance connected to the transformer secondary and then interpolating between the two load lines using a logarithmic equation. An option provided to the operator is to specify the value of the load capacitance or not. If the load capacitance is specified, the computer computes the phase angle for that value of load capacitance. If the load capacitance is not specified, the computer computes the value of capacitance with will produce a zero phase angle.

8 Claims, 19 Drawing Sheets

FIG.1  - PRIOR ART

```
CO = 90 PF          R0 = 45 KOHMS

CONNECT TRANSFORMER TO FIXTURE

------------------------------------
ENTER
C0,R0
```

```
CO = 90 PF          R0 = 45 KOHMS
```

```
        PRESS KEY (F1-F4) FOR MEASUREMENT

------------------------------------
XFMR      XFMR      XFMR      XFMR
#1A       #1        #2        #3
```

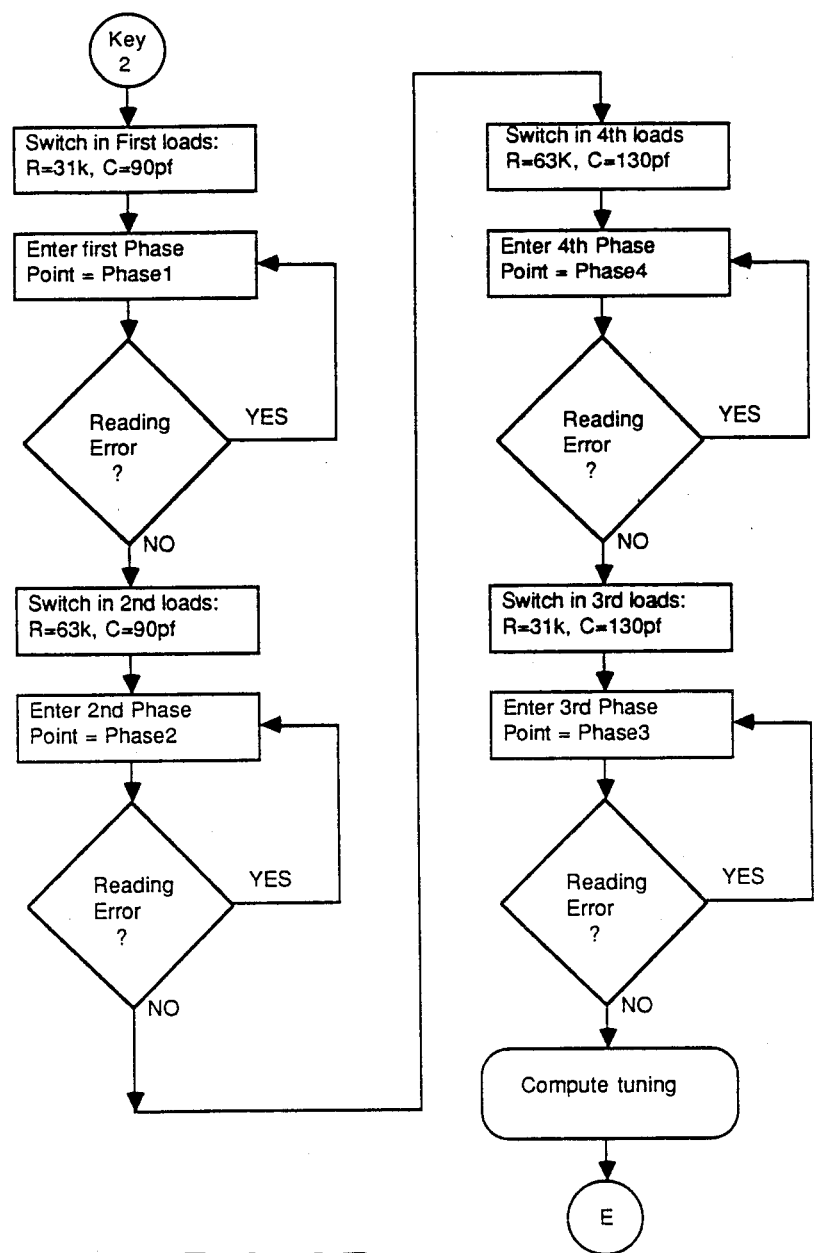
FIG.IOF

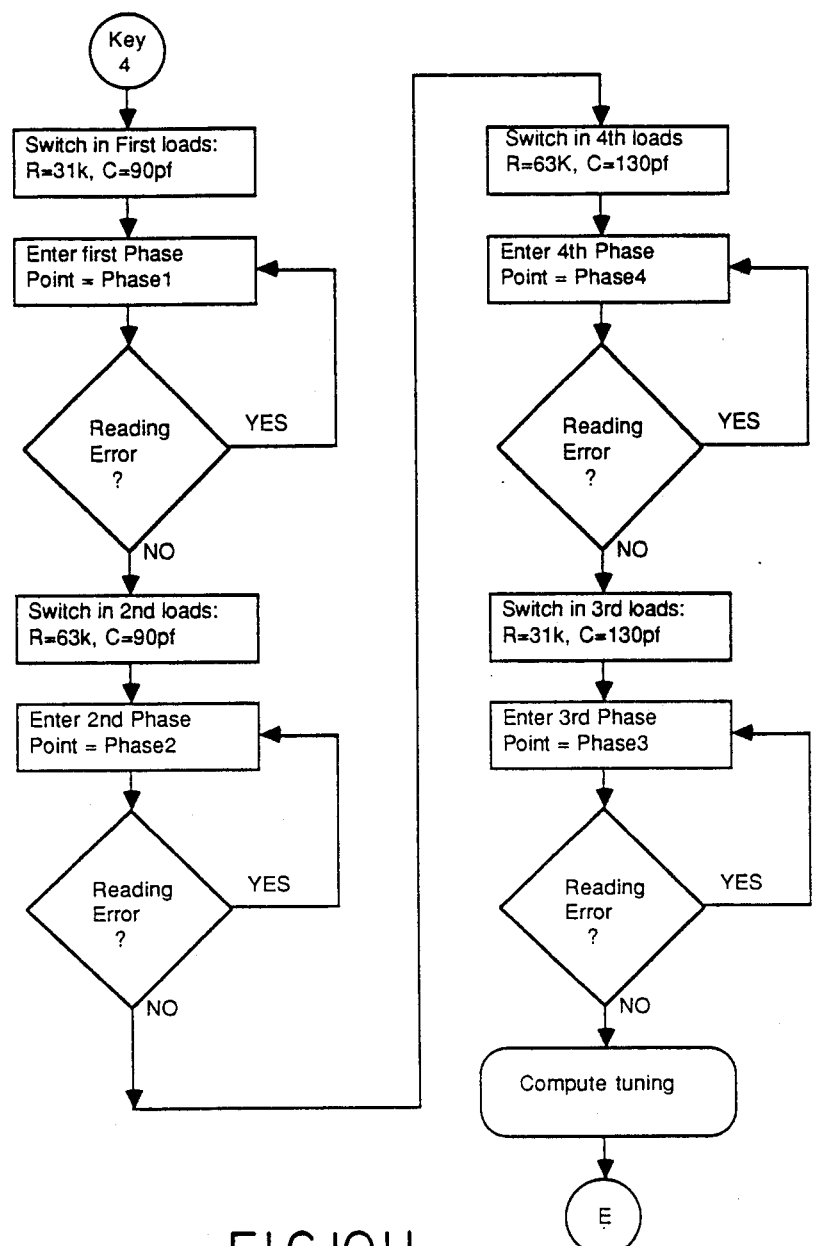
FIG.IOH

AUTOMATED MODELING METHOD FOR TUNING TRANSFORMERS

The Government has rights in this invention perusuant to Contract No. N00024-83-C-6126, awarded by the Department of the Navy.

DESCRIPTION

BACKGROUND OF THE INVENTION

1. Field of the Invention

The present invention generally relates to a method of tuning transformers with resistive and capacitive loads connected to the transformer to resonate at some given frequency and, more particularly, to an automated method for tuning a transformer to produce a resonant circuit in order to match elements within an acoustic array to transceiver electronics.

2. Description of the Prior Art

The tuning of transformers is useful for several applications. Tuning is done to produce a resonant circuit where the phase angles of the resulting current and the applied voltage are the same, that is, they are in phase. As used in the specific application described herein, the resonant circuit is produced between the reactive load created by a resistor and a capacitor and the transformer to be tuned. To tune a transformer using conventional methods, the values of capacitance and resistance are selected and connected to the transformer as shown in FIG. 1. In FIG. 1, the transformer 10 to be tuned has a primary winding 11 and a secondary winding 12. The secondary winding 12 has a plurality of reactive loads 13, 14 and 15 connected to it. These loads are represented by a resistor $R_o$ and a capacitor $C_o$ connected in parallel and may be connected across the entire winding of the secondary as indicated by load 13 or across intermediate taps of the secondary as indicated by loads 14 and 15. A signal generator 16 supplies a signal at the desired resonant frequency to amplifier 17 which drives the primary winding 11 of the transformer. An oscilloscope 18 having voltage and current inputs is connected in the primary circuit of the transformer. Specifically, the voltage inputs are connected across the primary winding 11, and the current inputs are connected to a current transformer 19. The core of the transformer was then moved until the circuit was purely resistive and the phase angle was zero degrees as indicated by a lissajous pattern on the oscilloscope 18. Alternatively, the phase angle could be measured by another phase sensitive device.

Also known in the prior art are methods of measuring impedance or calculating impedance knowing voltages and currents. For example, U.S. Pat. No. 4,342,089 to Hall describes impedance measurement calculations using a computer or a calculator. If the unknown impedance is Zx, Hall's method measures the voltage across Zx and across a range resistor Rs. This measurement is phase sensitive and provides the quadrature components needed to calculate the capacitance and inductance knowing the frequency. While this is a method to measure impedance, it is not related to the resonant adjustment of transformers using a computer.

Huang et al in U.S. Pat. No. 4,246,535 describe a method of design of a linear radio frequency amplifier. This method applies two signals of different frequencies to the circuit and then varies the impedance at the output while determining the output power of the amplifier for a family of load impedances. This patent goes on to describe a method to determine the desired linearity and maximum output power of the amplifier; however, Huang et al are not concerned with the tuning of transformers.

U.S. Pat. No. 4,404,636 to Campbell, Jr. et al describes a test set for measuring the phasor impedance of a circuit under test. The test set produces a frequency from a signal generator for application to the circuit being measured. The test set then measures the resistance and reactance components of the measured impedance. A microprocessor calculates the magnitude and phase of the impedance. While the Campbell, Jr. et al test set measures impedance, it is not used for the resonant adjustment of transformers.

U.S. Pat. No. 4,497,030 to Bowling et al describes a computer aided characterization of symmetrical N-way microwave power combining structures.

U.S. Pat. No. 3,082,373 to Hooke et al describes a method to adjust an alternating current bridge, specifically a Wien bridge, to obtain a null output in the shortest time possible. The Hooke et al procedure is specifically intended for the measurement of capacitors.

U.S. Pat. No. 3,319,162 to Sattinger also describes a method for measuring impedances. This is performed by a system similar to a conventional impedance bridge; however, the bridge is not nulled, and the magnitude of the voltage is used as a measure of the reactance of the circuit component.

U.S. Pat. No. 3,441,726 to Honore et al describes a method using a computer and passive devices to produce a circuit that appears as a variable impedance or admittance that is controllable. The variable impedance might be used as a model in, for example, an analog computer; however, the Honore et al method does not involve resonant tuning of a transformer by the use of a computer model.

U.S. Defensive Publication No. T940,013 to Ho describes the use of a computer to perform direct current or transient analysis on a network. Ho does not use any instruments to perform measurements on a physical device. Rather, Ho describes software modeling.

U.S. Pat. No. 4,300,196 to Lopresti describes the use of a computer to adjust circuit components. The computer is used as a feedback mechanism to adjust machine adjustable components within a circuit. The computer monitors the results of the adjusted components to produce new values that are used to adjust other adjustable components. Lopresti's method does not, however, cover the modeling and adjustment of transformers in a resonant circuit.

Thus, while the prior art generally discloses various methods of automated measurement of impedance values and even the adjustment of impedance values, there has not heretofore been known a satisfactory automated method for tuning a transformer to produce a resonant circuit in order to match elements wherein the phase angle of the resulting current and the applied voltage is in phase. While manual methods are known and suffice for the tuning of a single transformer, the problem of manually tuning an array of transformers, such as used for example in an acoustic array, becomes increasingly difficult to accomplish as the size of the array increases.

SUMMARY OF THE INVENTION

It is therefor an object of the invention to provide an automated method of tuning a transformer with a resistive and capacitive load to a resonant frequency.

It is another and more specific object of the invention to provide a technique which facilitates the tuning of transformers to match elements in an acoustic array to transceiver electronics.

According to the invention, the automated tuning of a transformer is accomplished by attaching resistors and capacitors to the transformer and then tuning the overall circuit for a given phase angle. A computer is used to select discrete values of resistance and capacitance in four combinations and measure the phase angles of the circuit for each combination. This data is then used by the computer to determine the phase angle of the tuned circuit. The method according to the invention models and predicts the response of the transformer to different values of resistive and capacitive loads without actually connecting loads having those values of resistance and capacitance to the transformer. The advantages of the invention are that it provides for a shorter setup time for tuning transformers and reduces the calibration needed because of fewer loads. In addition, more tuning values are available since the mathematical modeling is not dependent upon available loads.

BRIEF DESCRIPTION OF THE DRAWINGS

The foregoing and other objects, aspects and advantages of the invention will be better understood from the following detailed description of the preferred embodiment of the invention with reference to the drawings, in which:

FIGS. 10A to 10I, taken together, comprise a flow diagram of the computer program for the computer in the automated transformer tuning console shown in FIG. 2.

DETAILED DESCRIPTION OF THE PREFERRED EMBODIMENT OF THE INVENTION

Figure 1:
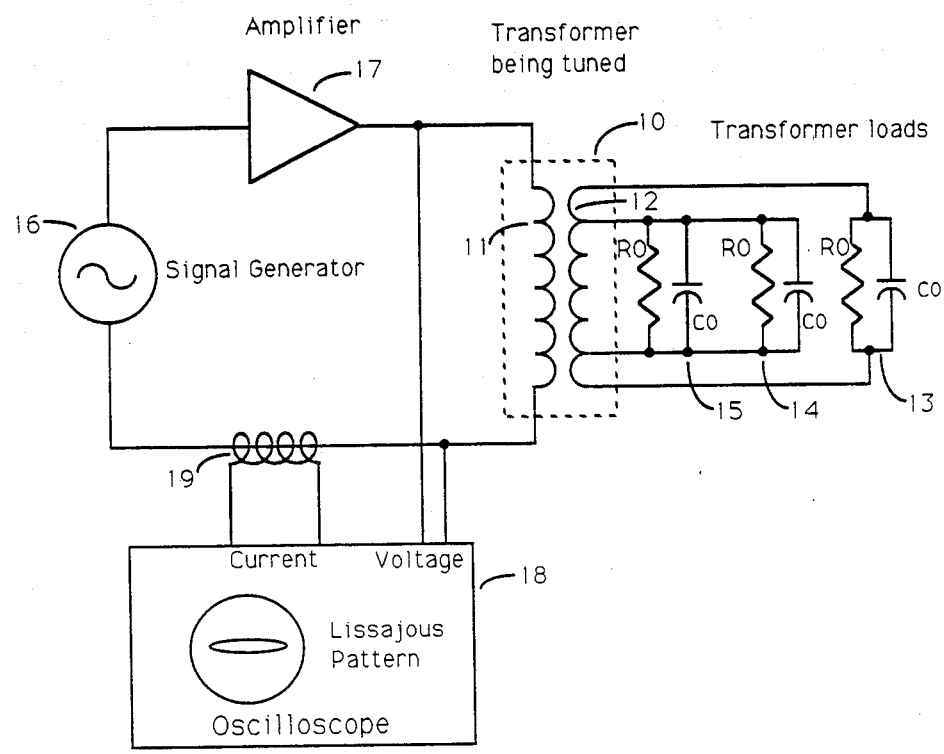
FIG. 1 is a block and schematic diagram of a prior art manual transformer tuning console.
Figure 2:
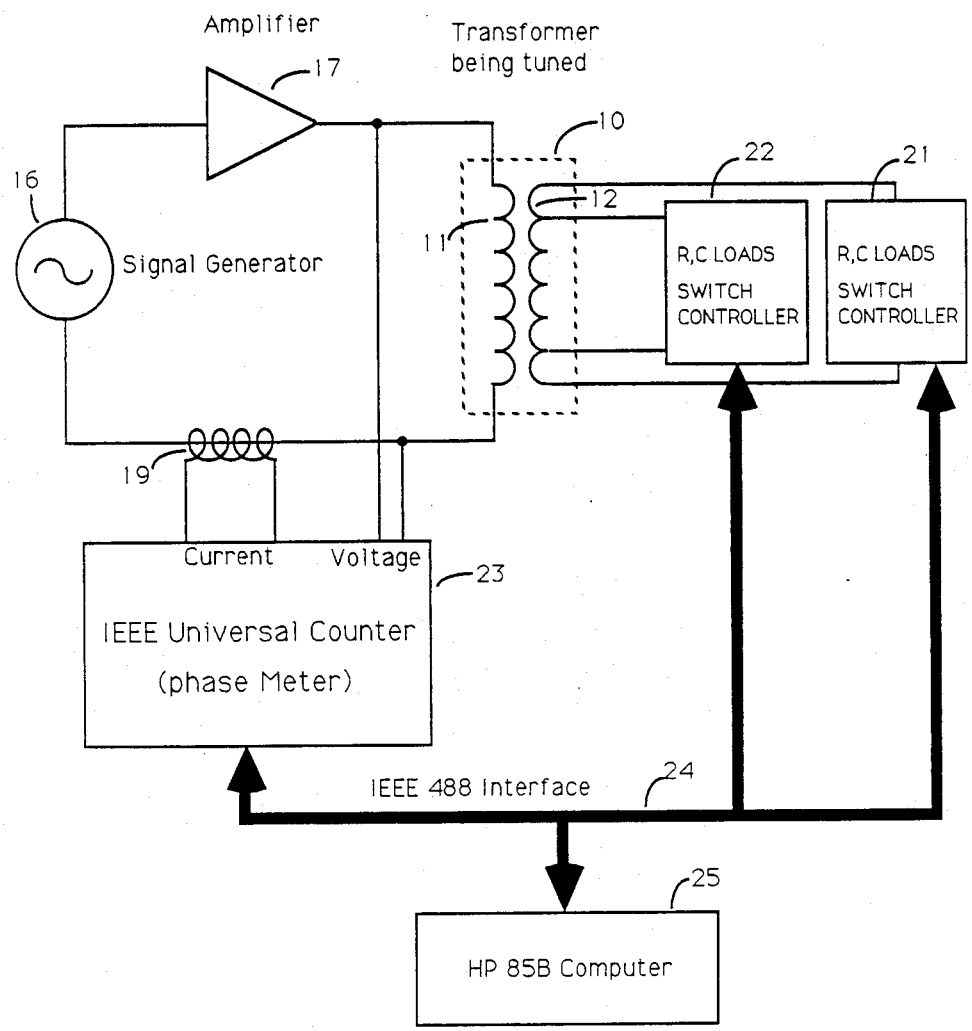
FIG. 2 is a block and schematic diagram of the automated transformer tuning counsole according to the invention.

Referring now to the drawings in which like reference numerals designate the same or equivalent components, and more particularly to FIG. 2, there is shown the automated transformer tuning console according to the invention. Instead of separate resistive and capacitive loads 13, 14 and 15 which are manually attached to the secondary winding 12 of the transformer 10 in various combinations, reactive loads are connected across the secondary winding and to intermediate taps on the secondary winding through switch controllers 21 and 22, respectively. The oscilloscope 18 is replaced with a phase meter 23, such as an IEEE universal counter, and the switch controllers 21 and 22 and the phase meter 23 are connected via an IEEE interface 24 to a microcomputer 25, such as a Hewlett-Packard HP 85 computer. The transformer's behavior is bounded by the measurement at four discrete points. The phase of the applied voltage and the resulting current is then measured at each of these points. This is used by the computer 25 to predict the phase angle of the transformer for any combination of resistance and capacitance.

Figure 3:
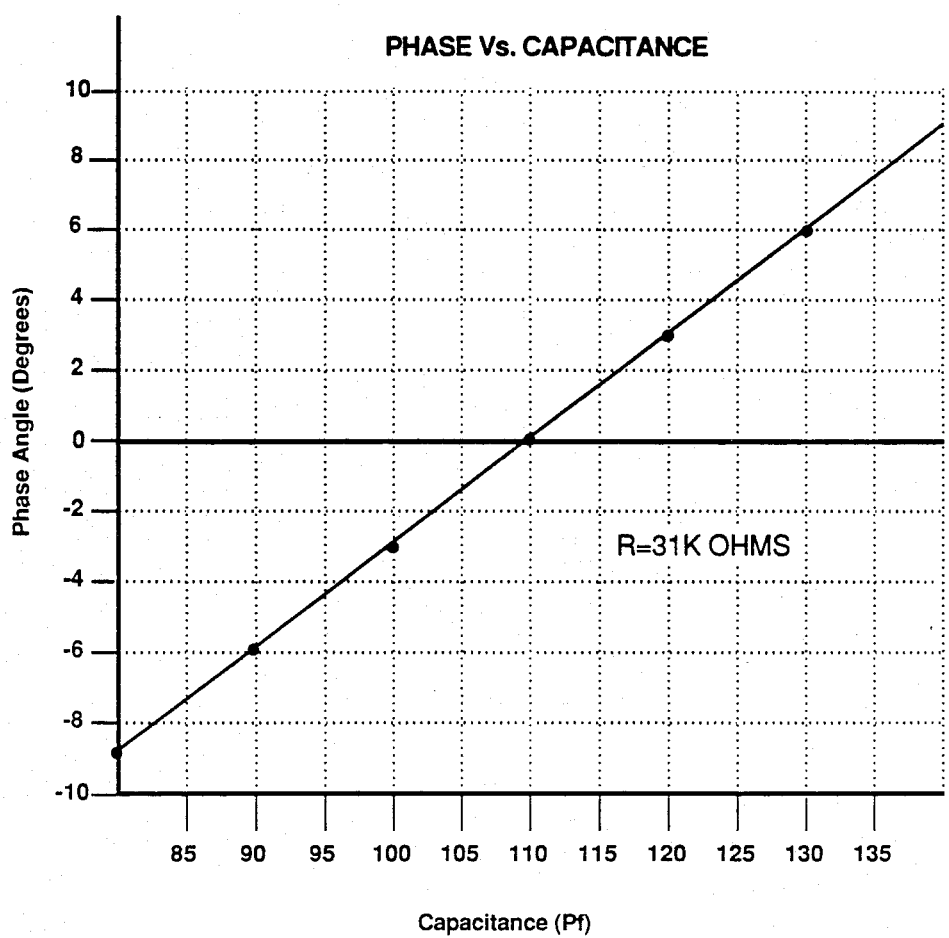
FIG. 3 is a graph showing the phase of a transformer plotted as a function of load capacitance with a fixed resistance.
Figure 4:
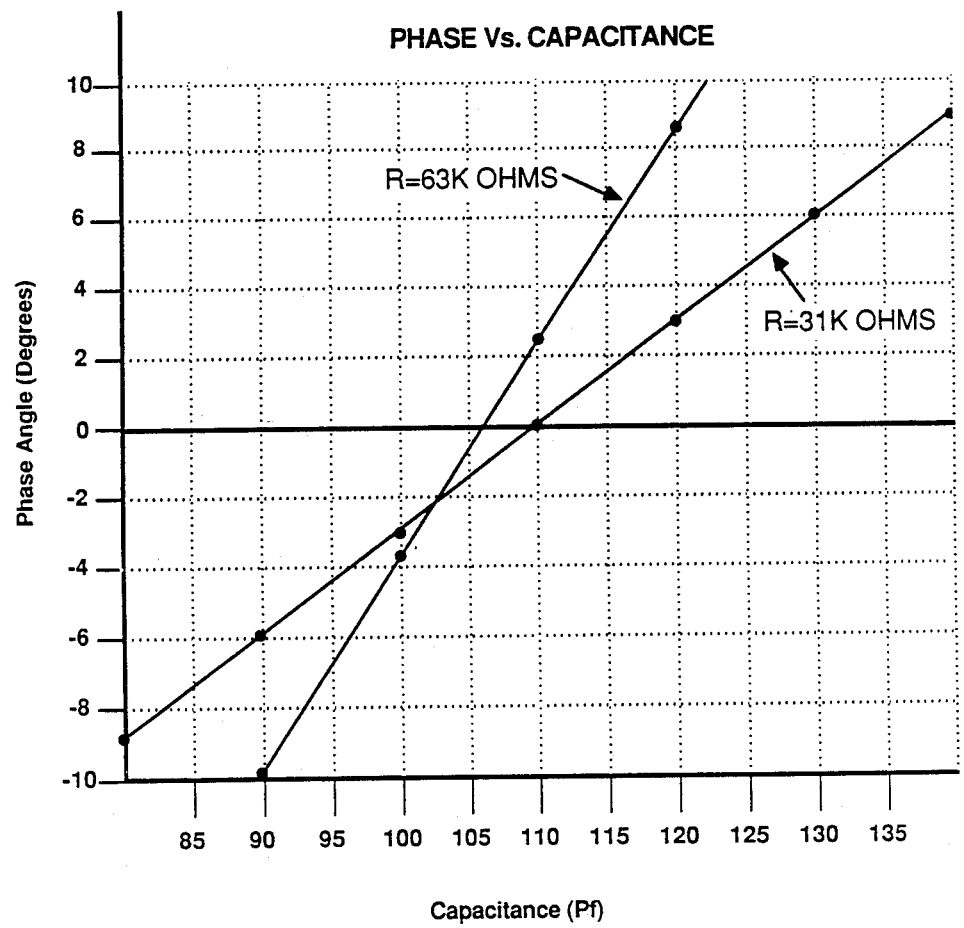
FIG. 4 is a graph showing the change in the load line of the transformer when the resistance of the load is changed.

The basis for the method according to the invention is shown in FIG. 3. Here the phase of a transformer is plotted as a function of load capacitance with a fixed resistance, and a fixed frequency. On the plot is a regression line that is the least mean square fit of the data points. The transformers are extremely linear with correlation coefficients greater than 0.999 around resonance. If the resistance of the loads were changed for the same transformer, there would be a different load line as shown in FIG. 4. The new method of tuning transformers is the interpolation between these lines, for a line where the resistance equals $R_o$, or the value of resistance that will actually be connected to the transformer.

Figure 5:
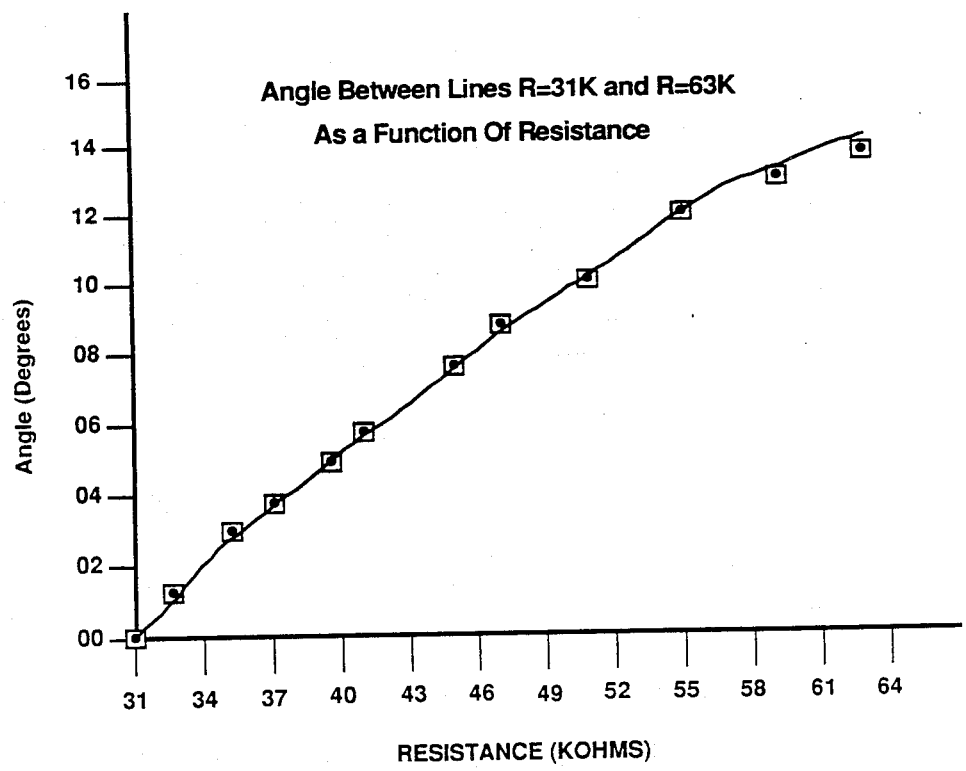
FIG. 5 is a graph showing the phase angle between load lines plotted against resistance.

The interpolating between these lines is done by bisecting the angle between the two resistance load lines. For this example, the two lines represent loads where R=31K ohms and the line where R=63K ohms. The bisecting of this angle is not a linear interpolation but a logarathmic one as shown by FIG. 5, where the angle between the line $R_o=R$ and the 31K ohm load line is plotted.

Figure 6:
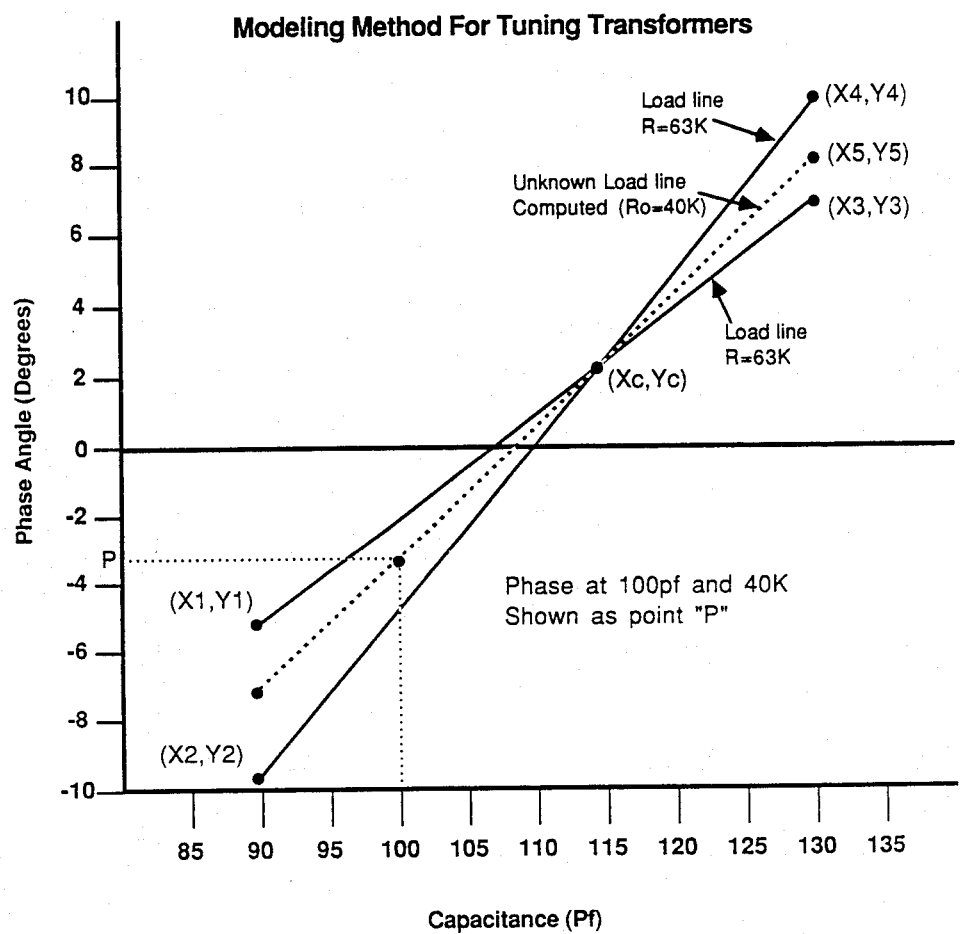
FIG. 6 is a graph showing the technique of finding an unknown load line by interpolating the angle between the load lines.

The determination of the phase of the transformer at $R_o$ and $C_o$ is done by first measuring the transformer at the four data points (X1, Y1), (X2, Y2), (X3, Y3), and (X4, Y4) as shown in FIG. 6. For example, the phase at the loads R=63K ohm and C=130 picofarads is designated Y4. The acutal intersection point is found by simultaneously solving the equations for the two lines. The equation of any line is $$Y = MX + J,$$

where M is the slope of the line and J is the Y intercept of the line. Solving for J, $$J = Y - MX.$$

This is a constant for the line, so any x,y pair can be used. The slope of the line where R=31K ohms is $$M3 = (Y3 - Y1)/(X3 - X1).$$

The slope of the line where R=63K ohms is $$M6 = (Y4 - Y2)/(X4 - X2).$$

Knowing two points for each line, the equations for each line can be found as shown below:

Line R=63K: $Y = Y1 - M6X1 + M6X$

Line R=31K: $Y = Y2 - M3X2 + M3X$

Finally, solving for the unknowns X and Y (designated XC, YC), $$XC = (Y1 - M3X1 + M6X2 - Y2)/(M6 - M3)$$

$$YC = (Y1 - M3X1 + M3XC)$$

This is the intersection of the two lines and is also a data point for the line we re trying to find. The next step is to find the slope of the line where $R = R_o$. Again referring to FIG. 5, if we let this line be represented by an equation of the form $$Y = A + B\log(X),$$

where Y is the slope of the line in degrees, A and B are constants, and X is the value of resistance, we can solve the equation for the values of A and B. This is done by simultaneously solving two equations since we already know the end points of this curve. These equations are as follows:

$$Tan(M3) = A + B\log(31000)$$

$$Tan(M6) = A + B\log(63000)$$

Solving these equations for A and B produces:

$$B = \frac{\text{Arctan}(M6) - \text{Arctan}(M3)}{\log(63000) - \log(31000)}$$

$$A = \text{Arctan}(M3) - B\log(31000)$$

Since we now have all the variables, we can solve for the slope of the new line where $R = R_o$:

$$M = Tan(A + B\log(R_o))$$

Using his for the slope and the point XC, YC we can find the equation for the line when $R = R_o$:

$$Y = YC - MXC + MC,$$

where Y is the phase angle in degrees for a C value of capacitance. Note that this equation can be solved for the value of capacitance that is needed to make the phase angle zero. This has added benefit for verifying the tuning of transformers. Notice also that while this method seems entailed, the computer's software performs all of this at the press of a single key. The software also displays a graphics picture to indicate if the transformer is tuned or not.

The correct values of $R_o$ and $C_o$ can be entered into this new tuning system since these are numbers in the computer model, and the transformers may now be tuned to these actual values of $R_o$ and $C_o$. This can be contrasted to the old tuning system which used discrete capacitors and resistors for loads. The difficulty with the conventional method is the number of available load values needed and the calibration of these loads to tight tolerances.

The new tuning system has the capability of determining the value of capacitance and resistance loads that would have to be connected to the transformer to obtain zero degree phase shift at resonance. This is not easy to do with a conventional transformer tuning console.

Figures 7A, 7B:
FIGS. 7A and 7B are examples of the basic computer screen displays in an actual implementation of the invention.

The computer display screens are shown in FIGS. 7A and 7B. The FIG. 7A screen is displayed when no transformer has been connected to the fixture in the tuning console shown in FIG. 2. This screen directs the operator to connect a transformer to the fixture. It also informs the operator what the current or default values of the load capacitance and resistance are. A data entry line is provided so that the operator can enter different values of capacitance and resistance. Once a transformer is connected to the fixture of the tuning console, the FIG. 7B screen is displayed. The console automatically determines when a transformer is attached and modifies the screen accordingly. When a transformer is attached, several function keys are enabled which, when pressed, evaluate the circuit as described above. In the example shown, the console can tune four different configurations of transformers, shown in FIGS. 8A to 8D, and these are enabled by pressing function keys F1 to F4, respectively, on the computer keyboard. Again, this screen clearly displays the values of capacitance and resistance which are currently connected as loads to the transformer. The horizontal line is a phase angle line and is used to display the relative phase angle between the transformer current and voltage. The major tic marks on the horizontal line indicate five degrees of phase shift. This phase is between the applied voltage and the resulting current which is applied to the transformer and the theoretical loads of $R_o$ and $C_o$ as shown in FIG. 3.

Figure 9A:
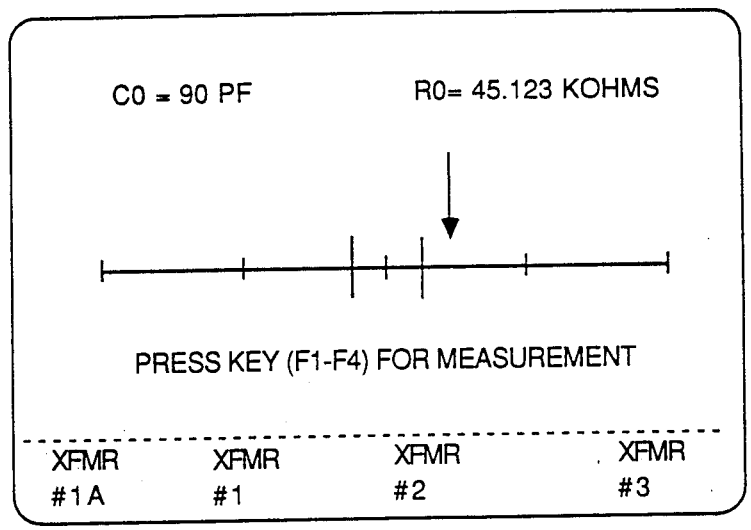
FIGS. 9A and 9B show the computer screen display of FIG. 7B during the tuning process according to the invention.
Figure 9B:
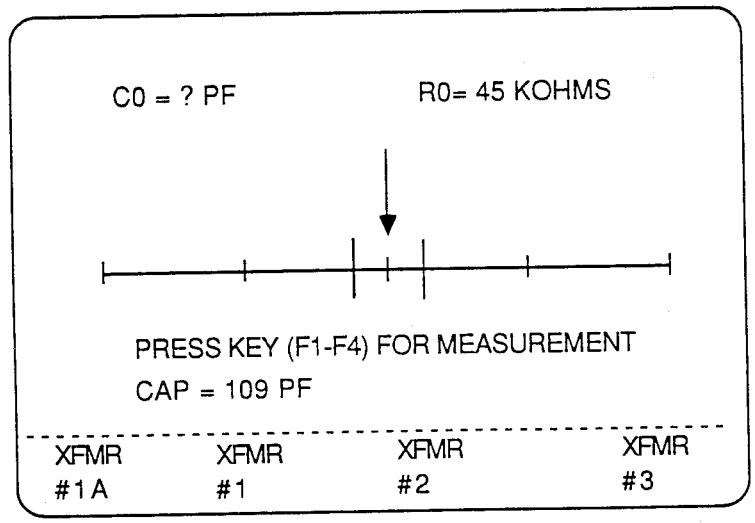

As will become more clear from the description of the computer software which follows, the tuning process can proceed with a fixed value of capacitance, as illustrated by the screen shown in FIG. 9A, or with an unknown value of capacitance, as illustrated by the screen in FIG. 9B. FIG. 9A shows the typical operating mode of the software. Here the tuning values ($R_o$, $C_o$) for the transformer have been entered into the system, and the operator then varies the tuning of the transformer until the vertical arrow is centered between the vertical limits shown in the display. The vertical arrow indicates a positive relative phase angle for the value of capacitance shown in the upper left corner of the screen indicating that the transformer is not completely tuned. As the tuning changes, the arrow slides horizontally across the display.

A particular advantage of this invention over other tuning methods is illustrated by the display screen in FIG. 9B. Here the $C_o$ tuning value was not entered into the program as indicated by the "?" at the top left corner of the screen. However, since the tuning is modeled by the program, the $C_o$ value can be determined by extrapolating the modeled load line shown in FIG. 6. This results in the value of $C_o$ which will make the system (transformer and loads) have a zero degree phase shift. The capacitance value is then displayed in the lower portion of the screen as seen in FIG. 9B.

Turning now to the flow diagrams shown in FIGS. 10A to 10I, the computer software will now be explained in detail. Beginning with the START balloon in FIG. 10A, the program performs a series of setup and initializing operations in function blocks 31 to 38. Specifically, the keyboard keys are masked and calibration data are loaded into memory in function blocks 31 and 32. Then the various resistance and capacitance variables are initialized in function block 33. After initialization, the frequency meter 23 and the switch controlers 21 and 22 are cleared in function block 34. The instrument is set for a timeout of 10 seconds in function block 35, and if a timeout occurs, there is a GOTO statement in function block 36 which branches the program to a timeout routine. This routine (not shown) aborts the instrument bus and clears the bus and then displays an error message to the operator before stopping the program. Assuming, however, that a timeout does not occur, the counter 23 is set to measure frequency in function block 37, and the oscillator frequency is read in function block 38.

When the oscillator frequency has been read, it is tested in decision block 39 to determine if it is the correct frequency. If not, an error message is displayed in function block 40, and the program is stopped. Assuming, however, that the frequency is correct, then the program goes to the top of FIG. 10B. The counter 23 is set for a phase measurement in function block 41, and the standards built into the console are tested in function block 42. If the standards do not pass the test as determined in decision block 43, an error message is displayed in function block 44 and the program loops to retest the standards. If the standards have passed the test, then the instrument timeouts are turned off in function block 45 and the function keys are displayed on the screen in function block 46. The function keys are enabled in function block 47 and, if key 1 or 5 is pressed, a GOTO instruction branches the program to an enter tuning values subroutine.

In function block 48, phase data is entered from the counter 23. A test is made in decision block 49 to determine if there is an error in the phase reading indicating that no transformer is connected to the fixture, then the program loops and the screen shown in FIG. 7A is displayed. On the other hand, if a transformer is connected, the screen shown in FIG. 7B is displayed and the program goes to the top of FIG. 10C. A test is made in decision block 50 to determine if the value of $R_o$ is zero. If it is, the operator is prompted to enter values for $R_o$ and $C_o$ in function block 51. In either case, the program goes to function block 52 where the function keys are enabled for transformer types. The graphics picture of tuning (see FIG. 9A) is displayed in function block 53. A check is made in decision block 54 for an instrument timeout. If an instrument timeout has occured, the program branches to function block 55 where the instruments are cleared and then to function block 45 in FIG. 10B where the instrument timeouts are turned off. Assuming, however, that no timeout has occured, a test is made in decision block 56 to determine if a key has been pressed. If not, the program loops and waits for a key to be pressed. When a key is pressed, tests are made in decision blocks 57, 58 and 59 to determine what key has been pressed.

Figure 8A:
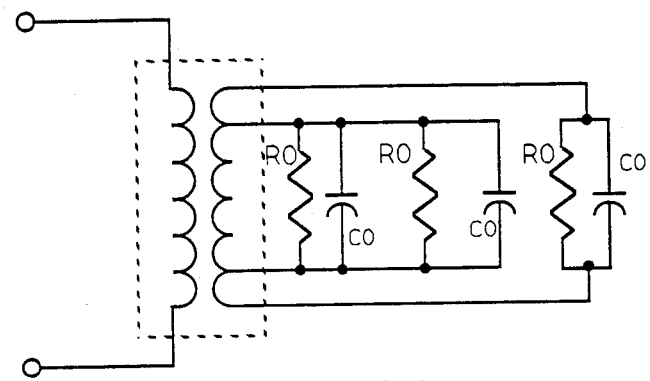
FIGS. 8A, 8B, 8C, and 8D are schematic diagrams of four transformers of different configurations that can be tuned using the preferred embodiment of the tuning console shown in FIG. 2.
Figure 8B:
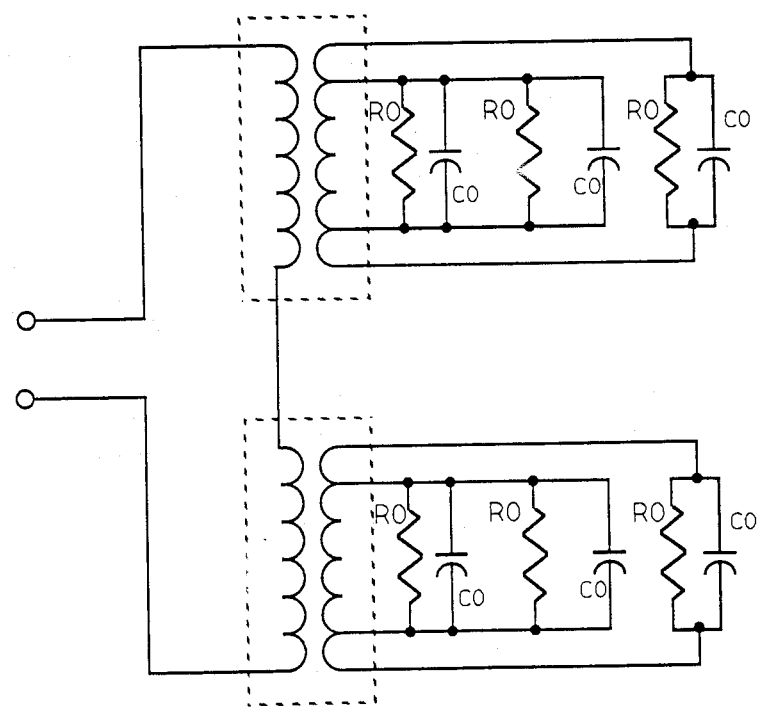
Figure 8C:
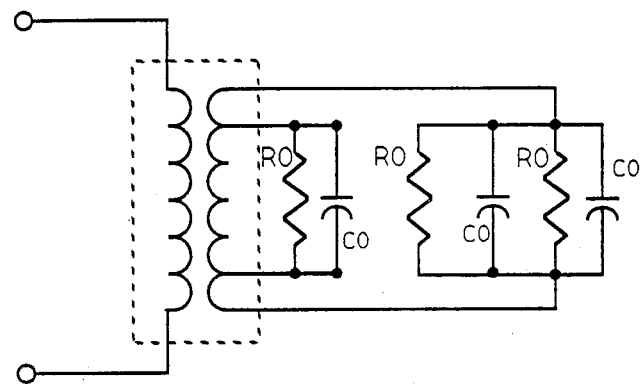
Figure 8D:
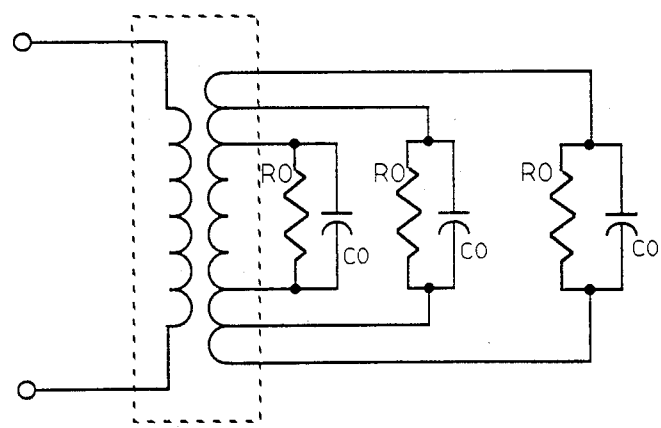

Assume first that key number 1 has been pressed indicating that a transformer of the configuration 1 shown in FIG. 8A is to be tuned. In this case, the program goes to FIG. 10E where the first thing that occurs is that the first loads are switched in by switch controllers 21 and 22 in function block 60. The first phase point is entered in function block 61, and a test is made in decision block 62 to determine if there is a reading error. If there is, the program loops back to function block 61; otherwise, the second loads are switched in function block 63. The second phase point is entered in function block 64 and, again, a test is made in decision block 65 to determine if there is a reading error. If there is not, the fourth loads are switched in function block 66 and the fourth phase point is entered in function block 67. A check is made in decision block 68 for a reading error. If there is no reading error, the third loads are switched in function block 69 and the third phase point is entered in function block 70. A final test is made for reading error in decision block 71 before the compute tuning subroutine in function block 72 is called.

The compute tuning subroutine is shown in FIG. 10I to which reference is now made. The subroutine is entered at function block 72. The first step is to erase the previous graphics display in function block 73. Then, in function block 74, the slope of the load line for resistance value of the second and fourth loads is computed. This is followed in function block 75 by the computation of the slope of the load line for the resistance value for the first and third loads. The coordinates of the intersection of these two load lines are then computed in function blocks 76 and 77. The variables which define the line shown in FIG. 5 are then computed in function blocks 78, 79 and 80. At this point, a test is made in decision block 81 to determine if a capacitance value has been entered. If so, the phase for that capacitance value is computed in function block 82, and the subroutine exits to function block 53 in FIG. 10C. Otherwise, the capacitance for zero phase is computed in function block 83, and then the subroutine exits to function block 53 in FIG. 10C.

Figure 10A:
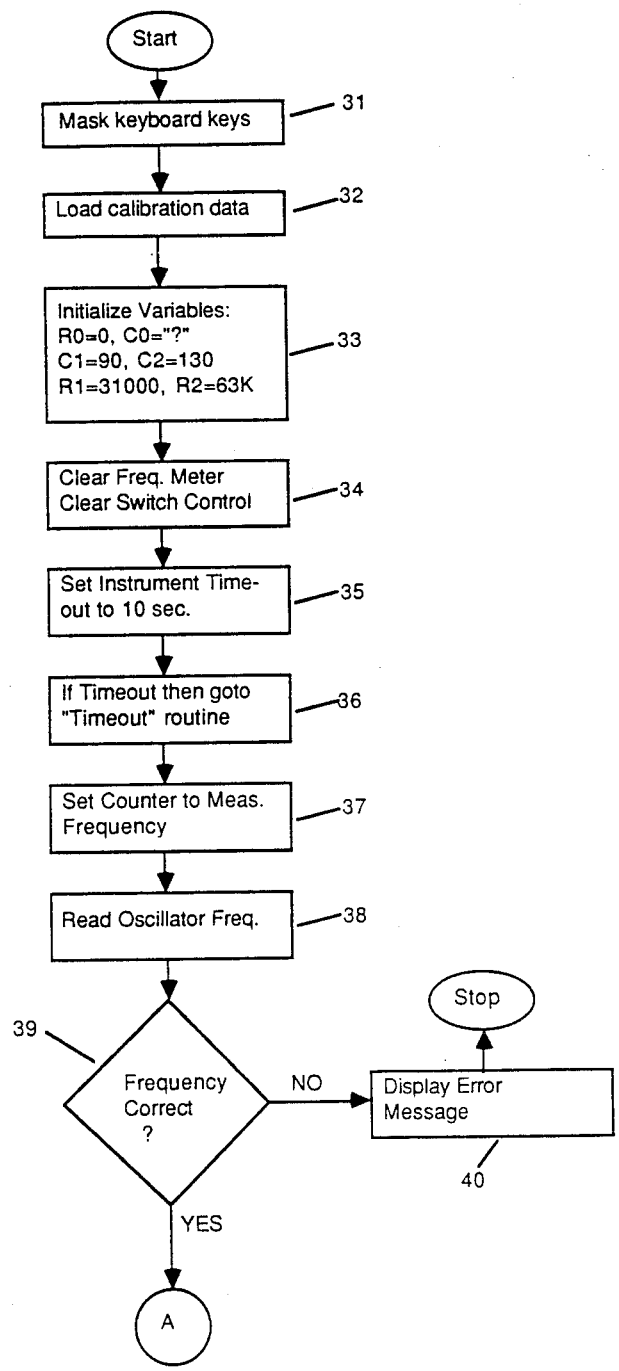
Figure 10B:
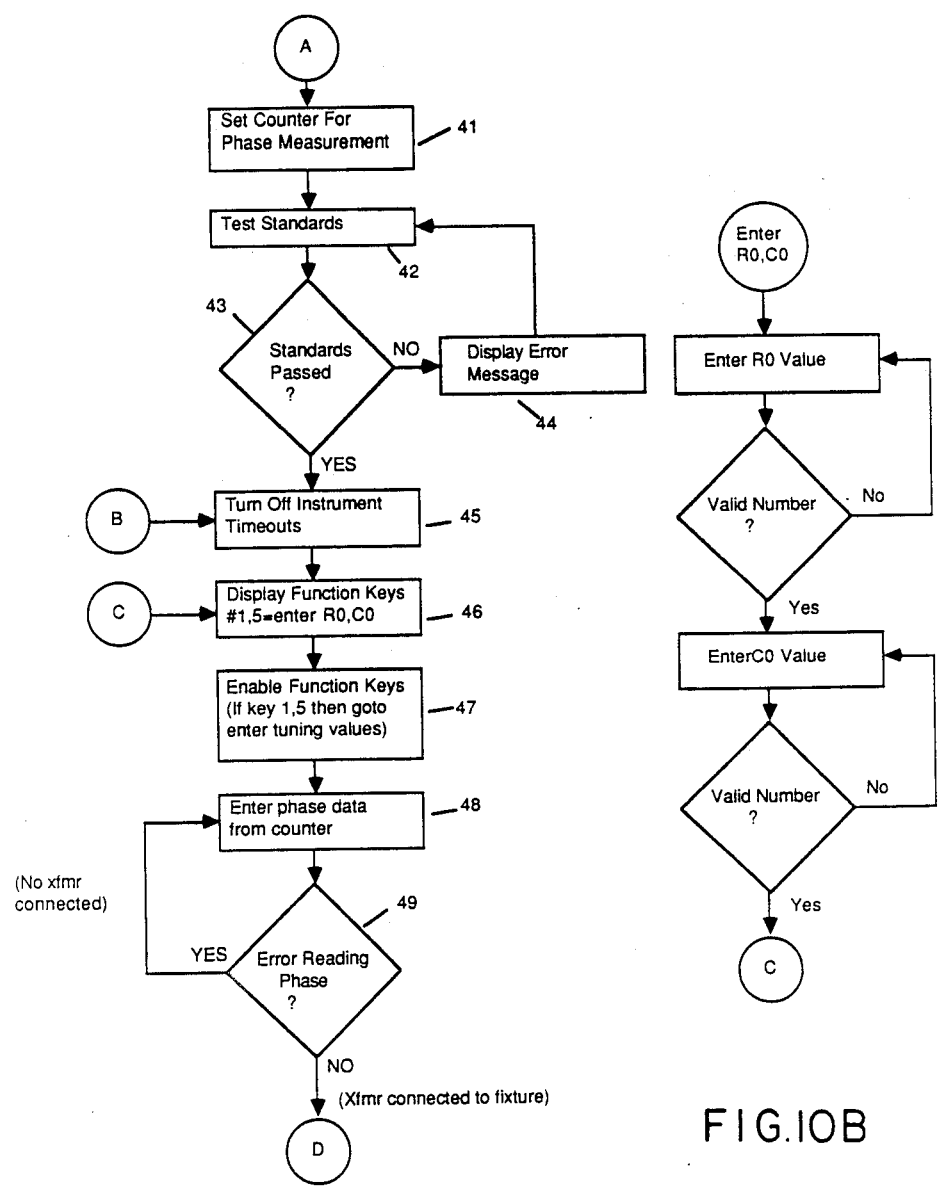
Figure 10C:
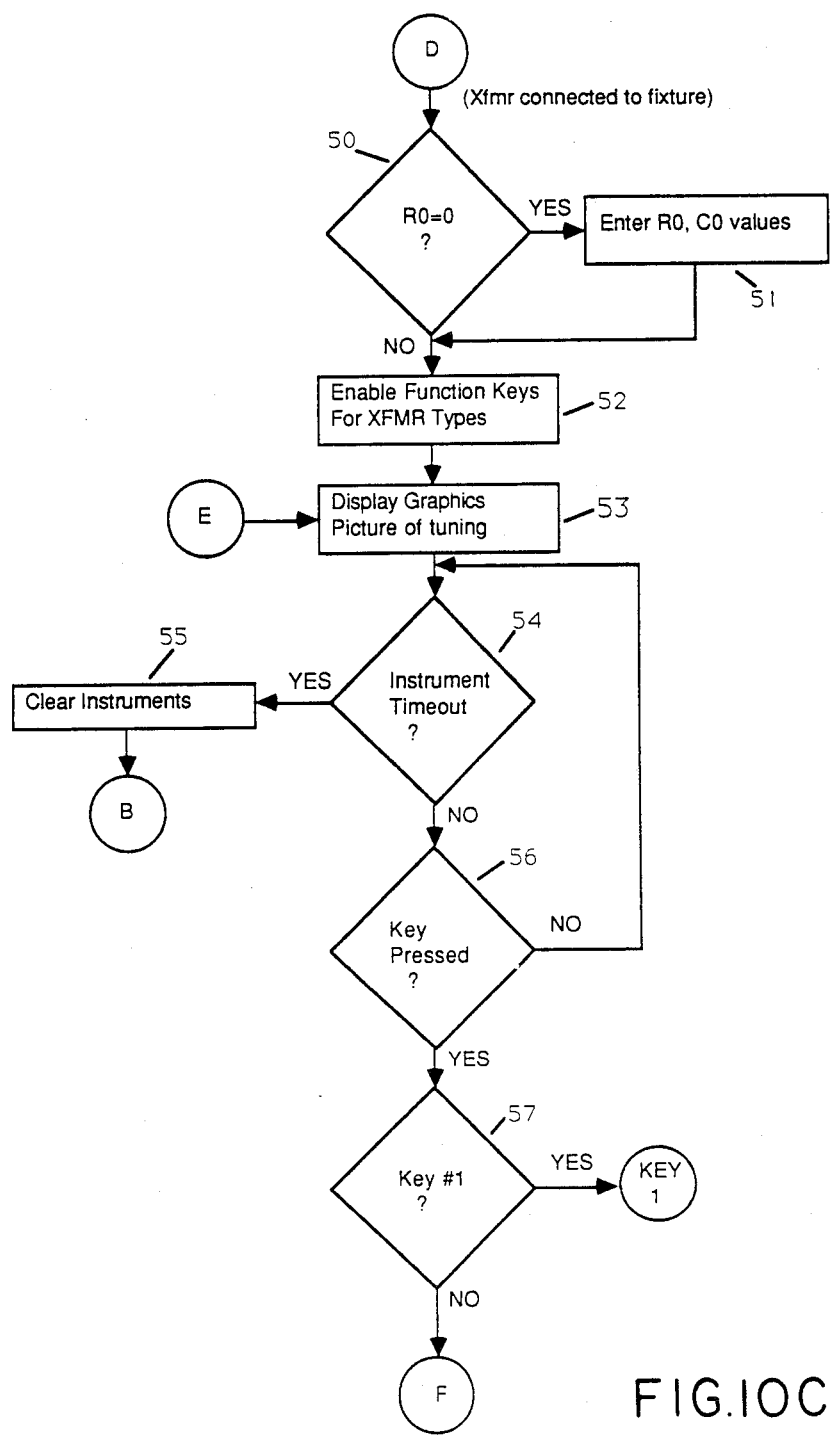
Figure 10D:
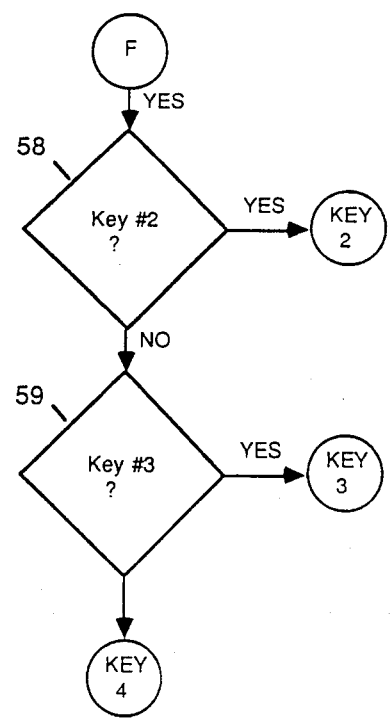
Figure 10E:
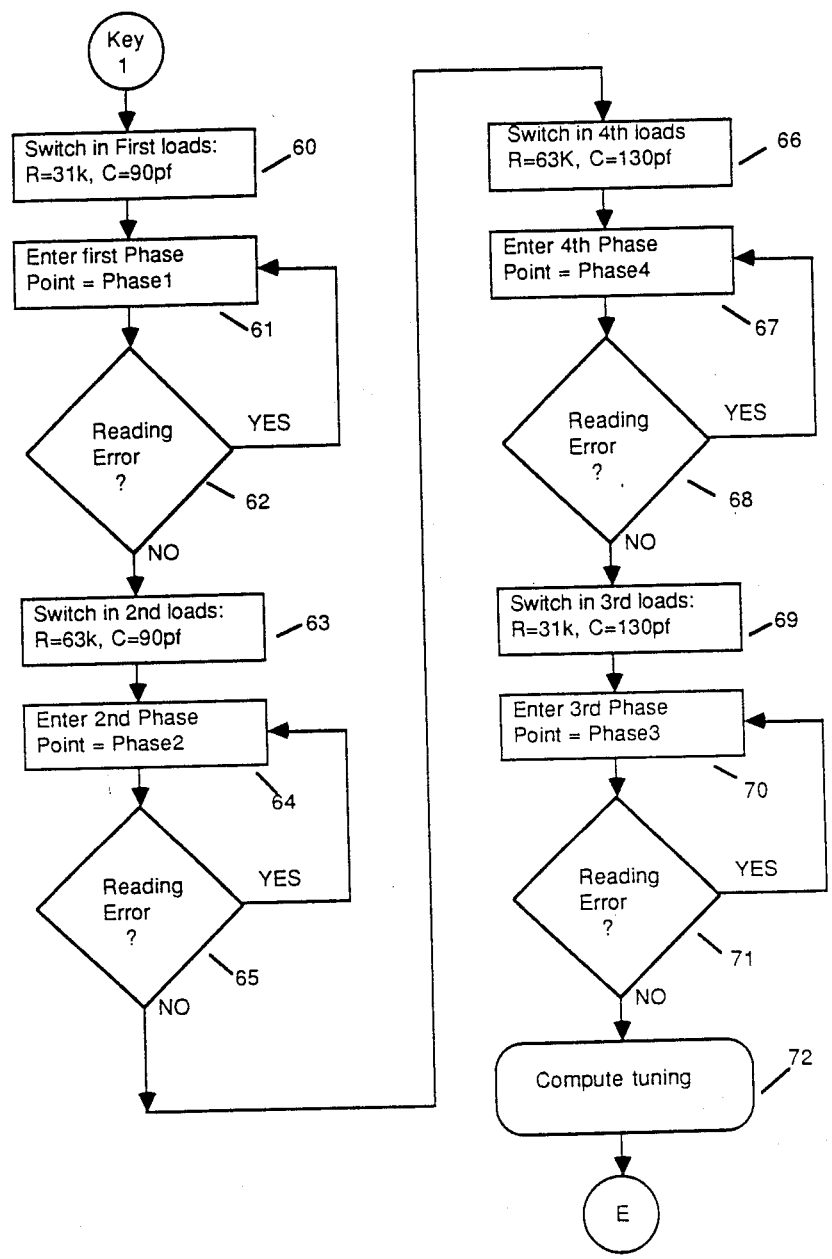
Figure 10G:
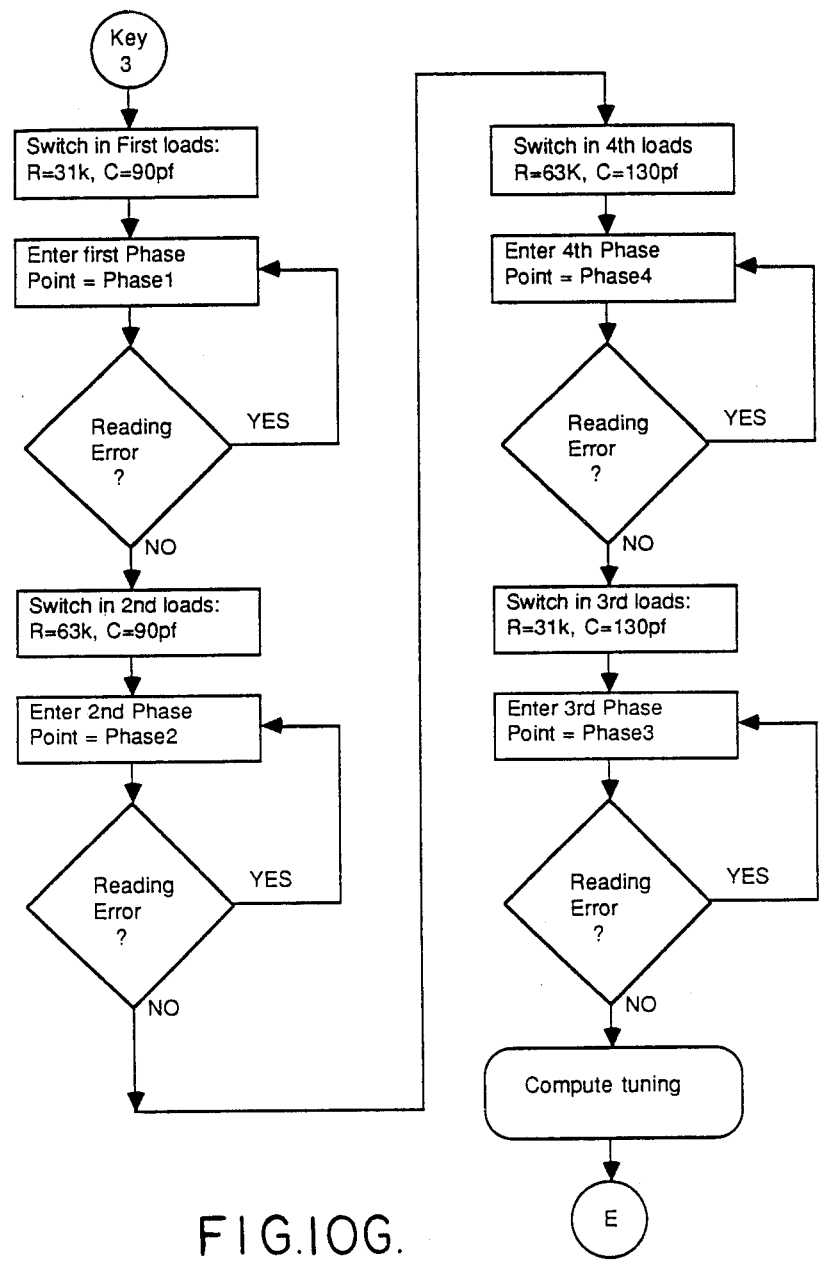
Figure 101:
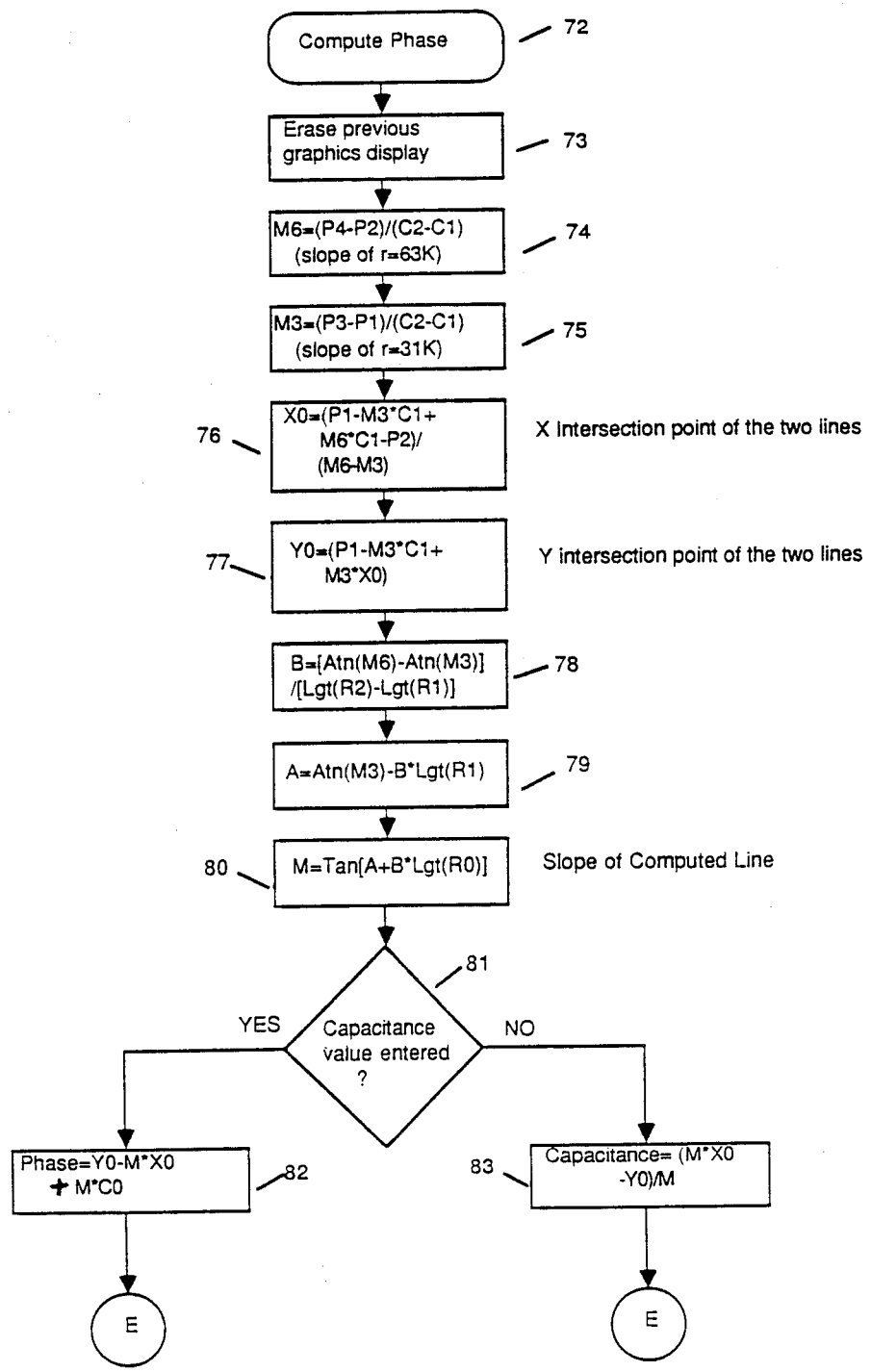

Returning now to FIG. 10D, the tests in decision blocks 57 and 58 detect whether keys 2, 3 or 4 have been pressed. The flow diagrams for each of these conditions is shown in FIGS. 10F, 10G and 10H, respectively, and these flow diagrams are essentially identical with that of FIG. 10E. The differences are the actual values of the resistors and capacitors connected to the test fixture and where the loads are connected to each of the different transformer types shown in FIGS. 8B, 8C and 8D.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A computer automated method for tuning transformers to produce a resonant circuit with a zero degree phase angle to match a resistive and capacitive load to another circuit, said transformers having a primary winding and a secondary winding, said computer automated method comprising the steps of:
   selecting discrete values of different combinations of resistance and capacitance loads;
   connecting under the control of said computer four combinations of selected resistance and capacitance loads to the secondary winding of a transformer;
   exciting the primary winding of the transformer with a signal of predetermined frequency;
   measuring under the control of said computer the phase for each combination of resistance and capacitance loads connected to the secondary winding;
   determining with said computer, from the values of the loads and the measured phases for each combination of loads, two load lines for the transformer; and
   interpolating with said computer between the two load lines using a logarithmic equation to find the required values of resistance and capacitance to produce a zero degree phase angle at resonance.

2. The computer automated method for tuning transformers as recited in claim 1 further comprising the steps of:
   testing to determine if a transformer to be tuned is connected for tuning and, if not, prompting an operator to connect a transformer to be tuned;
   prompting the operator to select one of a transformer connected for tuning; and
   depending on the type of transformer selected by the operator, performer the step of connecting combinations of selected resistance and capacitance loads by using different values of resistance and capacitance for each load and connecting each load to different points on said secondary winding.

3. The computer automated method for tuning transformers as recited in claim 1 wherein the step of measuring the phase for each combination of resistance and capacitance loads is performed by the steps of:
   switching in a first combination of resistance R1 and capacitance C1;
   measuring the phase for the first combination of resistance R1 and capacitance C1 to establish a first data point;
   switching in a second combination of resistance R2 and capacitance C1;
   measuring the phase for the second combination of resistance R2 and capacitance C1 to establish a second data point;
   switching in a fourth combination of resistance R2 and capacitance C2;
   measuring the phase for the fourth combination of resistance R2 and capacitance C2 to establish a fourth data point;
   switching in a third combination of resistance R1 and capacitance C2; and
   measuring the phase for the third combination of resistance R1 and capacitance C2 to establish a third data point.

4. The computer automated method for tuning transformers recited in claim 3 wherein the step of determining is performed by the steps of:
   using the fourth and second data points and the capacitance values C1 and C2, computing the slope of a load line for a constant resistance of R2; and
   using the third and first data points and the capacitance values C1 and C2, computing the slope of a load line for a constant resistance of R1.

5. The computer automated method for tuning transformers recited in claim 4 wherein the step of interpolating comprises the steps of:
   computing the intersection point of said two load lines; and
   using said logarithmic equation, having the form $Y = A + B*\log(X)$, to compute the slope of a load line having the equation $$Y = YC - M*XC + M*C,$$

where Y is the dependent variable of the line and is equal to the phase angle in degrees for a C value of capacitance which is the independent variable of the line, XC and YC are points on the line and M is the slope of the line.

6. The computer automated method for tuning transformers recited in claim 5 further comprising the steps of:
   giving an operator an option of entering a value of load capacitors; and
   if a value of load capacitance has been entered, computing the phase Y for the C value of capacitance entered by the operator; otherwise, computing the value of capacitance for a slope Y=0.

7. A system for automated tuning of transformers to produce a resonant circuit with a zero degree phase angle to match a resistive and capacitive load to another, said transformers having a primary winding and a secondary winding, said system comprising:
   a source of excitation signals connected to said primary winding, said signals having a predetermined frequency;
   a plurality of switch controllers connected to different points on said secondary winding, each of said switch controllers switching in different values of resistance and capacitance as reactive loads to said secondary winding;
   a phase meter connected to measure the phase of the current in said primary winding; and
   a computer connected to said plurality of switch controllers and to said phase meter, said computer being programmed to control said switch controllers to switch in four different combinations of resistance and capacitance loads, to determine from the values of the loads and the measured phases for each combination of loads two load lines for the transformer, and to interpolate between the two load lines using a logarithmic equation to find the required values of resistance and capacitance to produce a zero degree phase angle at resonance.

8. The system for automated tuning of transformers as recited in claim 7 further comprising a fixture for connecting a plurality of different types of transformers for tuning, said computer further being programmed to switch in different combinations of resistance and capacitance to different points on said secondary winding depending on the type of transformer connected in said fixture.

* * * * *